(12) United States Patent
Chih et al.

(10) Patent No.: US 6,351,681 B1
(45) Date of Patent: Feb. 26, 2002

(54) METHOD AND APPARATUS FOR A MULTI-CHIP MODULE THAT IS TESTABLE AND RECONFIGURABLE BASED ON TESTING RESULTS

(75) Inventors: David Chih, Scarborough; Lee K. Lau, Don Mills; Keith S. K. Lee, Markham, all of (CA)

(73) Assignee: ATI International Srl, Barbados (KY)

( * ) Notice: Subject to any disclaimer, the term of this patent is extended or adjusted under 35 U.S.C. 154(b) by 0 days.

(21) Appl. No.: 09/197,720

(22) Filed: Nov. 23, 1998

Related U.S. Application Data

(63) Continuation-in-part of application No. 08/853,303, filed on May 9, 1997, now Pat. No. 5,956,252.

(51) Int. Cl.$^7$ .......................... G06F 19/00; G01R 31/26
(52) U.S. Cl. ....................... 700/121; 324/765
(58) Field of Search ............................. 700/121; 711/2, 711/129, 170, 171; 324/755, 756, 758, 760, 765

(56) References Cited

U.S. PATENT DOCUMENTS 5,541,525 A * 7/1996 Wood et al. ................ 324/755
5,640,762 A * 6/1997 Farnworth et al. ............. 29/833
5,781,486 A * 7/1998 Merritt ........................ 365/201
6,209,075 B1 * 3/2001 Lau ............................. 711/171

* cited by examiner

Primary Examiner—Paul P. Gordon
(74) Attorney, Agent, or Firm—Vedder, Price, Kaufman & Kammholz

(57) ABSTRACT

A method and apparatus for a multi-chip module that is testable and reconfigurable based on testing results is accomplished by a multi-chip module that includes a first circuit disposed on a first chip substrate, a second circuit disposed on second chip substrate, and an interconnecting substrate operably coupled to the first chip substrate and the second chip substrate. The interconnecting substrate connects the first circuit to the second circuit. The interconnecting substrate includes external connectors for accessing signals within the multi-chip module, which allow the multi-chip module to be fully tested. This testing may include isolating the first circuit and/or the second circuit by disabling other circuits in order to allow each of the circuits to be exercised without interference from other circuits. After testing the multi-chip module, configuration circuitry included on the multi-chip module may be used to reconfigure the multi-chip module based on results of the testing.

32 Claims, 5 Drawing Sheets

METHOD AND APPARATUS FOR A MULTI-CHIP MODULE THAT IS TESTABLE AND RECONFIGURABLE BASED ON TESTING RESULTS

This patent application is a continuation-in-part of U.S. patent application Ser. No. 08/853,303, filed May 9, 1997 of a patent application, entitled "Method and Apparatus for an Integrated Circuit that is econfigurable based on Testing Results," having the same assignee as the present patent application, an issue date of Sep. 21, 1999, and a U.S. Pat. No. 5,956,252.

FIELD OF THE INVENTION

The invention relates generally to multi-chip module circuits, and more particularly to a multi-chip module that is testable and reconfigurable based on testing results.

BACKGROUND OF THE INVENTION

Multi-chip modules are known to include the package that houses an interconnecting substrate upon which a plurality of die are coupled. The number of die that may be included in the multi-chip module can vary greatly. In order to ensure functionality of a multi-chip module, extensive tests are performed upon each of the die within the multi-chip module. Although it is well understood how to perform these tests before the die are mounted within the multi-chip module, testing issues can arise once the entire module has been packaged. Signals that are routed directly between two different integrated circuits within the module may not be accessible external to the multi-chip module.

As the complexity of multi-chip modules in terms of the number of integrated circuits and interconnect within the multi-chip module continues to increase, the possibility of failure on the part of one or more of the integrated circuits deposited on the die within the multi-chip module also increases. In addition to this, the robustness of the overall multi-chip module is related to the complexity of the integrated circuits that are deposited upon each of the die within the multi-chip module, as more complex circuits are more likely to include a defect leading to failure.

Understandably, problems arise when failures are detected within the multi-chip module. In such instances the entire multi-chip module is normally rendered unusable, and is therefore scrapped. Because the circuits within the multi-chip module are designed and configured with the assumption that all of the circuitry within the multi-chip module will be functional, non-functionality of any one portion will render the entire system inoperable. Failures within a multi-chip module can be prohibitively expensive as the number of die within the multi-chip module and the complexity of those die increases.

For example, if a manufacturer wished to integrate a number of complex and expensive circuits upon a multi-chip module, the manufacturer may be hesitant to do so for fear that the process of integration would inflict defects upon one or more of the integrated circuits. In such a case, the cost of all of the integrated circuits combined on the multi-chip module would be incurred due to the failure of any one. Similarly, problems with the mounting substrate can cause the entire multi-chip module to fail. Thus, the cost of producing complex multi-chip modules can be prohibitive.

Therefore a need exists for a method and apparatus that allows for complete testing of a multi-chip module, and also allows for reconfiguration of a multi-chip module based on the testing results.

DETAILED DESCRIPTION OF A PREFERRED EMBODIMENT OF THE INVENTION

Generally, the present invention provides a method and apparatus for testing multi-chip module and reconfiguring the multi-chip module based on the testing results. This may be accomplished by a multi-chip module that includes a first circuit disposed on a first chip substrate, a second circuit disposed on second chip substrate, and an interconnecting substrate operably coupled to the first chip substrate and the second chip substrate. The interconnecting substrate connects the first circuit to the second circuit. The interconnecting substrate includes external connectors for accessing signals within the multi-chip module, which allow the multi-chip module to be fully tested. This testing may include isolating the first circuit and/or the second circuit to allow each of the circuits to be exercised without interference from the other circuit. After testing the multi-chip module, configuration circuitry included on the multi-chip module may be used to reconfigure the multi-chip module based on results of the testing. This reconfiguring enables only operational portions of the multi-chip module to be active in the final product. By allowing for full testability of all of the integrated circuits mounted within a multi-chip module and also allowing the final configuration of the multi-chip module to be based upon the functionality of the integrated circuits within the multi-chip module, the cost of producing complex multi-chip modules is reduced. In addition to cost reduction, the testability of the multi-chip module ensures that a quality product with tested and proven functionality will be produced.

Figure 1:
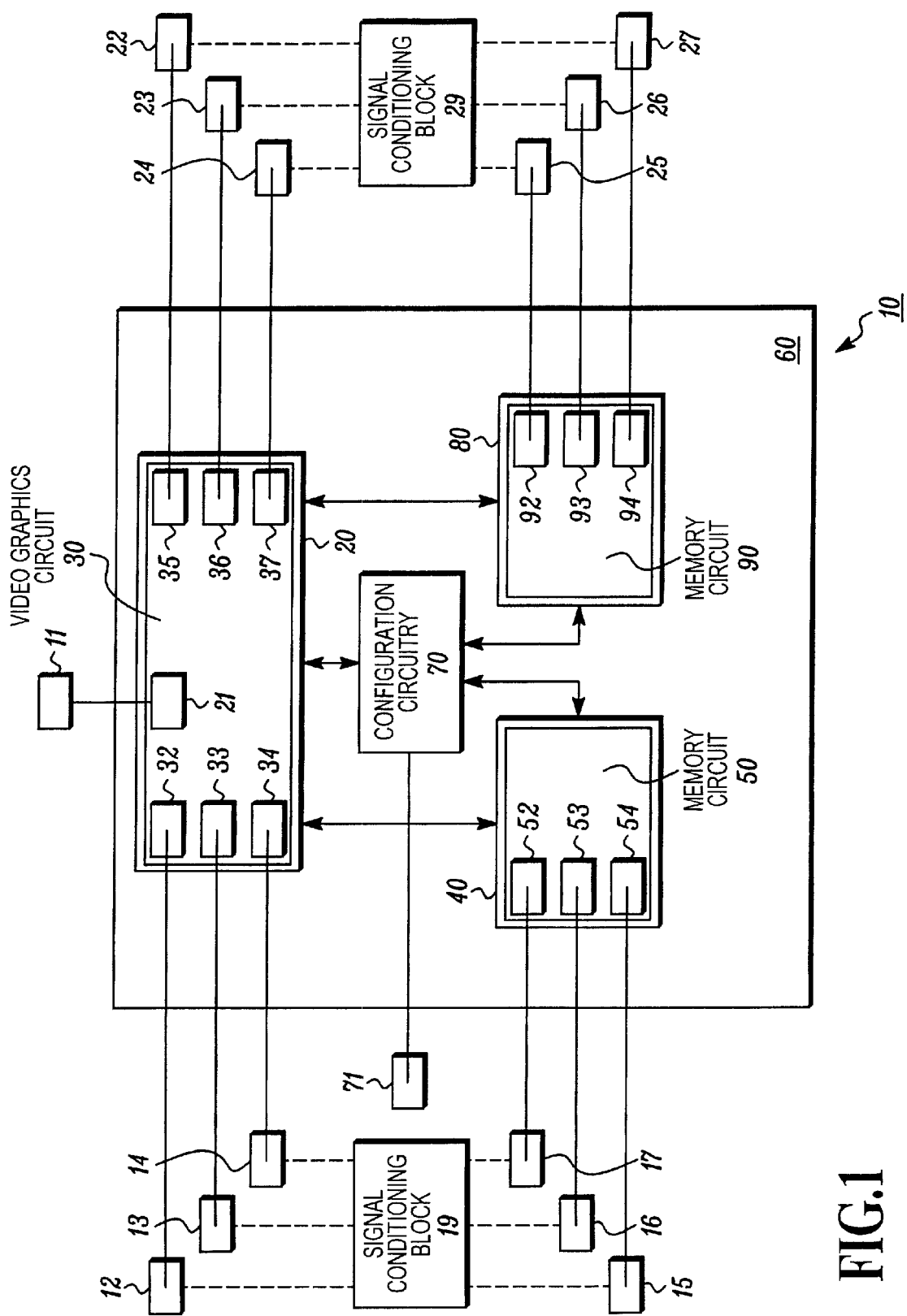
FIG. 1 illustrates a block diagram of a video graphics multi-chip module in accordance with the present invention.

The present invention can be more fully described with reference to FIGS. 1–5. FIG. 1 illustrates a block diagram of a video graphics multi-chip module 10 which includes a video graphics circuit 30 disposed on a first chip substrate 20, a memory circuit 50 disposed on a second chip substrate 40, and an interconnecting substrate 60 operably coupled to the first chip substrate 20 and the second chip substrate 40. The interconnecting substrate 60 electrically couples the video graphics circuit 30 to the memory circuit 50. The interconnecting substrate 60 further includes external connectors 12–17.

The video graphics circuit 30 may be a complex video graphics circuit which would typically include a memory controller and interface, a display controller, a display interface, a graphics controller, a video input/output interface, and a host bust interface. Such a complex video graphics controller may be used in a personal computer that is requires a complex video graphics display. Such a video graphics circuit 30 may be designed for an expansion card for coupling within a personal computer. In order to minimize the complexity of the expansion card, manufacturing the video graphics circuit 30 within a multi-chip module with other components, such as the memory circuit 50, may be advantageous.

The video graphics circuit 30 typically requires a large amount of memory in order to operate. In order to satisfy this need, the memory circuit 50 may be synchronous dynamic random access memory (SDRAM), read-only memory (ROM), or another form of memory with which the graphics processor 30 is able to interact. In typical applications, the graphics processor 30 will couple to the memory 50 via a bus structure.

The bus structure includes control lines, address lines, and data lines. In a typical system, the number of data lines can be very large. For example, a video graphics circuit may have a 64-bit data bus. The data bus may not need to be directly accessible external to the multi-chip module 10 for reasons other than testing, and including portions of the bus exclusively within the multi-chip module can greatly reduce the number of pins or external ports on the multi-chip module. This type of implementation still requires that the entire bus eventually undergo testing. In some cases, the testing issues may be solved via a built-in self test (BIST) implemented within the multi-chip module 10. When BIST is employed, the data bus may not be brought out to external ports of the multi-chip module 10.

However, in other embodiments, testing of the video graphics circuit 30 and/or the memory 50 requires that interference of other integrated circuits within the multi-chip module 10 be eliminated by providing external access to certain signals within the multi-chip module 10. In an example embodiment which satisfies this requirement, the video graphics circuit 30 includes a first control signal output 32 for controlling the memory circuit 50. The first control signal output 32 is coupled to the external connector 12 of the interconnecting substrate 60. The memory circuit 50 includes a control signal input 54 that is also coupled to an external connector 15 of the interconnecting substrate 60.

In this embodiment, when the video graphics multi-chip module 10 is in a testing mode, input to the control signal input 54 of the memory 50 is provided via the external connector 15. Similarly, output from the output control signal of the video graphics circuit 30 is received on the external connector 12. This allows the individual signals to be monitored and controlled independently. In an operational mode, the external connector 12 is coupled to the external connector 15, which effectively routes the output control signal 32 of the video graphics circuit 30 directly to the input control signal 54 of the memory 50.

While the control signal in this case is brought to an external connector of the multi-chip module 10, the majority of the signals between the video graphics circuit 30 and the memory 50 can be routed internally via the interconnecting substrate 60. Allowing the control signals of the multi-chip module 10 to be accessed from external to the multi-chip module 10, permits a tester to control operation of the memory 50 while monitoring the control signal outputs of the video graphics integrated circuit 30.

Another advantage to allowing access to the control signals is maintaining signal integrity of the signals. By allowing access to the signal external to the multi-chip module, the signal can be manipulated in order to improve its condition when received by the memory 50. For example, if the control signal is a clock, the clock signal integrity may be improved by filtering, glitch removal, or level shifting. If such a clock signal is routed completely internal to the multi-chip module, such operations are not possible. The signal conditioning block 19 illustrated in FIG. 1 may include circuitry to perform such conditioning functions. It should be apparent to one skilled in the art that other noncontrol signals may be intentionally routed external to the multi-chip module to allow such conditioning to occur.

In another embodiment, the video graphics circuit 30 may include a plurality of control signal outputs 32–34 for controlling the memory circuit 50. In such an embodiment, the memory 50 includes a plurality of input control signals 52–54. Each of the control signal outputs 32–34 of the video graphics circuit 30 is coupled to an external connector 12–14 of the interconnecting substrate 60. Similarly, each of the input control signals 52–54 of the memory 50 is coupled to an external connector 15–17 of the interconnecting substrate 60.

When in a testing mode, the control outputs 32–34 of the video graphics circuit 30 can be accessed by a tester via external ports 12–14. The input control signals 52–54 of the memory 50 are accessible to the tester via external ports 15–17. The tester can receive and compare the outputs of the video graphics circuit 30 while providing control information to the memory 50 such that the memory 50 does not interfere with testing of the video graphics circuit 30.

In an operational mode, the control outputs 32–34 of the video graphics circuit 30 are actively coupled to the control input 52–54 of the memory circuit 50. In order to provide such a coupling, the external connectors 12–14 may simply be connected to the external connectors 15–17. The individual coupling of the external connectors should be based on the routing of the output control signals to the appropriate input control signals. As described earlier, signal conditioning block 19 may be used to ensure the signal integrity of one or more of the control signals 52–54 that are presented to the memory circuit 50.

Preferably, the plurality of control signals 32–34 of the video graphics circuit 30 includes a clock output, a chip select output, and a clock enable output. To complement this, the plurality of control signal inputs 52–54 of the memory 50 circuit includes a clock input, a chip select input, and a clock enable input. When a predetermined set of signals is applied to the clock input, chip select input, and clock enable input of the memory circuit 50, it is possible to disable the memory circuit 50. When the memory circuit 50 is disabled, the video graphic circuit 30 can be tested without any interference from the memory circuit 50. When the memory circuit 50 is disabled by these control signals, the outputs of the memory circuit 50 may be placed in a tri-stated mode. The tri-stated mode places the outputs in a high-impedance mode that prevents them from interfering with other portions of the circuit to which they are coupled. Typically, the set of control inputs required to disable the memory circuit 50 would be generated via a tester external to the multi-chip module. However, some form of self-test such as a BIST algorithm and/or BIST hardware may generate these control signal inputs.

Similarly, the video graphics circuit 30 may be configured to include a test input 21 or other set of input control signals that allow the circuit 30 to be disabled. The test input 21 may be a signal dedicated to testing purposes or may be a control signal that is used for other purposes in operation, but which is able to recognize a signal pattern that indicates testing. The test input 21 is coupled to an external connector 11 of the interconnecting substrate 60 to allow external access. When a predetermined input is applied to the test signal 21 of the video graphics circuit 30, the circuit 30 is disabled, which allows the memory circuit 50 to be tested without interference. When the video graphics circuit 30 is disabled, output signals of the video graphics circuit may be placed in a tri-state mode as described above in order to ensure that the memory circuit 50 or other circuits of the multi-chip module 10 can be accurately tested.

In the embodiment where only the control signals that connect the video graphics circuit 30 with the memory circuit 50 are brought out to external connectors of the interconnecting substrate 60, a large number of signals must be routed internal to the multi-chip module between the video graphics circuit 30 and the memory circuit 50. In order to accommodate this, the interconnecting substrate may include a four-layer substrate. Each layer of the substrate is composed of a conducting material for use in coupling the video graphics circuit 30 to the memory circuit 50. Preferably, one layer of the interconnecting substrate may be used for power, another layer may be used for ground, and the final two layers may be used for routing of data, address, and other signals. It should be apparent to one skilled in the art that other forms of interconnecting substrate may be used to construct multi-chip modules, including substrates with greater or fewer than four layers.

The packaging for a multi-chip module is typically comprised of a package with a number of external connectors which may be pins, a grid array of bumps, or other types of connectors typically associated with packaging technology. Preferably, the multi-chip module 10 is mounted in a package that includes a bump grid array. The bump grid array allows external connectors of the multi-chip module 10 to be easily coupled together on a printed circuit board or other board. For example, if control signals of the video graphics is circuit 30 and the memory 50 are brought out for testing purposes, these control signals can be routed to particular bumps in the bump grid array which are positioned adjacent to each other. These adjacent bumps can then be coupled using a small amount of interconnecting material deposited on the circuit board upon which the multi-chip module 10 is mounted. Minimizing the amount of interconnect is beneficial because it minimizes delay and other undesirable parasitics.

Once testing of the multi-chip module 10 has been successfully performed, it may be determined that one or more of the circuits of the multi-chip module 10 is not functioning properly. In order to avoid having to scrap the entire multi-chip module 10 due to the malfunctioning of the single integrated circuit on the multi-chip module 10, configuration circuitry 70 may be included in the multi-chip module 10. The configuration circuitry 70 is operably coupled to the other circuits included in the multi-chip module 10, and the configuration circuitry 70 may be controlled via control signals provided via the externally accessible port 71 of the interconnecting substrate 60. The externally accessible port 71 may include a single or a number of externally accessible pads on the interconnecting substrate 60.

After testing of the integrated circuits of the multi-chip module 10 has been performed, the configuration circuitry 70 can be used to reconfigure the multi-chip module 10 based on the functional status of the video graphics circuit 30 and the memory circuit 50. For example, if testing determines that the memory circuit 50 fails, it is desirable to package the multi-chip module 10 such that the functionality of the video graphics circuit 30 is maintained. This allows the multi-chip module 10 to be used as a stand-alone video graphics integrated circuit that may then be mounted on a board with additional external memory. Note that in order to accommodate interaction with additional external memory, the multi-chip module 10 may have to be packaged in a different type of package than that used when the memory internal to the multi-chip module is functional. In other words, additional pins or bumps may be included on the package to allow the address and data bus of the graphics processor 30 to be accessed from external to the multi-chip module 10.

If the graphics processor 30 fails in testing, the memory 50 may still be used if the multi-chip module 10 is packaged or configured to allow full access to the memory 50. Once again this may force the multi-chip module to be packaged in a package that includes more connectors for the address and data bus of the memory circuit 50. Alternately, the configuration circuitry 70 may simply reroute signals within an already packaged multi-chip module. For example, if the multi-chip module 10 is packaged prior to testing and the graphics processor 30 is found to be defective, the routing of signals internal to the multi-chip module 10 may be reconfigured to allow normally inaccessible signals to be accessed via external ports. Because the multi-chip module 10 may include a large number of additional circuits disposed on additional die, the operation of the configuration circuitry 70 can become important in ensuring the economic feasibility of large complex multi-chip modules.

Additionally, the multi-chip module 10 may further include an additional memory circuit 90 disposed on a third chip substrate 80. As illustrated in FIG. 1, the interconnecting substrate 60 operably couples the additional memory circuit 90 to the video graphic circuit 30. As before, the address and data lines that run between the video graphic circuit 30 and the memory circuit 90 may be routed completely internal to the multi-chip module 10. In the embodiment illustrated in FIG. 1, the video graphics circuit 30 may include a 64 bit data bus wherein 32 bits of the data bus are provided by memory circuit 50 and the other 32 bits of the data bus are provided by the memory circuit 90. In such a case, if either of the memory circuits fail, it may be preferable to mount the multi-chip module 10 in a package or configure the multi-chip module via configuration circuitry 70 such that only the video graphic circuit 30 is functional. Similarly, if the video graphic circuit 30 fails, a package that allows both of the memory circuits 50 and 90 to be functional would be desirable.

As stated earlier, in order to accurately test the video graphic circuit 30 and the memory 90, control signals 35–37 of the video graphic circuit 30 can be brought out to external connectors 22–24 of the interconnecting substrate 60. This allows these control signals 35–37 to be accessed during testing. Similarly, the control signals 92–94 of the memory circuit 90 are brought out to external connectors 25–27 to allow the tester to provide control signals to the memory 90. These control signals 92–94 can be asserted in such a way as to disable the memory circuit 90 and allow the video graphic circuit 30 to be fully tested without interference. As described with respect to the first memory circuit 50 earlier, a signal conditioning block 29 may be included in the system to ensure the signal integrity of one or more of the control inputs 92–94 of the additional memory circuit 90.

In another embodiment, one or more of the control signal inputs 92–94 of the additional memory 90 may be driven by the same control signal outputs as one or more of the control signal inputs 52–54 of the first memory 50, in such a case, the number of external connectors coupled to the video graphics circuit 30 may be reduced, as one control signal output is used to drive multiple control signal inputs. This may very well be the case in a system where the memory circuits 50, 90 are each N bits wide and are utilized in parallel by a bus structure as a single (2*N) bit-wide memory block.

Although the circuits mounted within the multi-chip module 10 are likely tested before being mounted on the interconnecting substrate 60, the interconnectivity of the circuits, and the functionality of the circuits after mounting must be tested. When testing indicates that a portion of the multi-chip module 10 is not functioning correctly, the configuration circuitry 70 can be utilized to partition off the non-functional portions of the multi-chip module 10 such that the functional portions are still operable and can be utilized. The testing flexibility and configuration flexibility of the present invention ensures that the cost of multi-chip modules does not become prohibitive. Expensive components can be inserted in multi-chip modules with the assurance that if other portions of the multi-chip module fail, functional portions may still be utilized.

Figure 2:
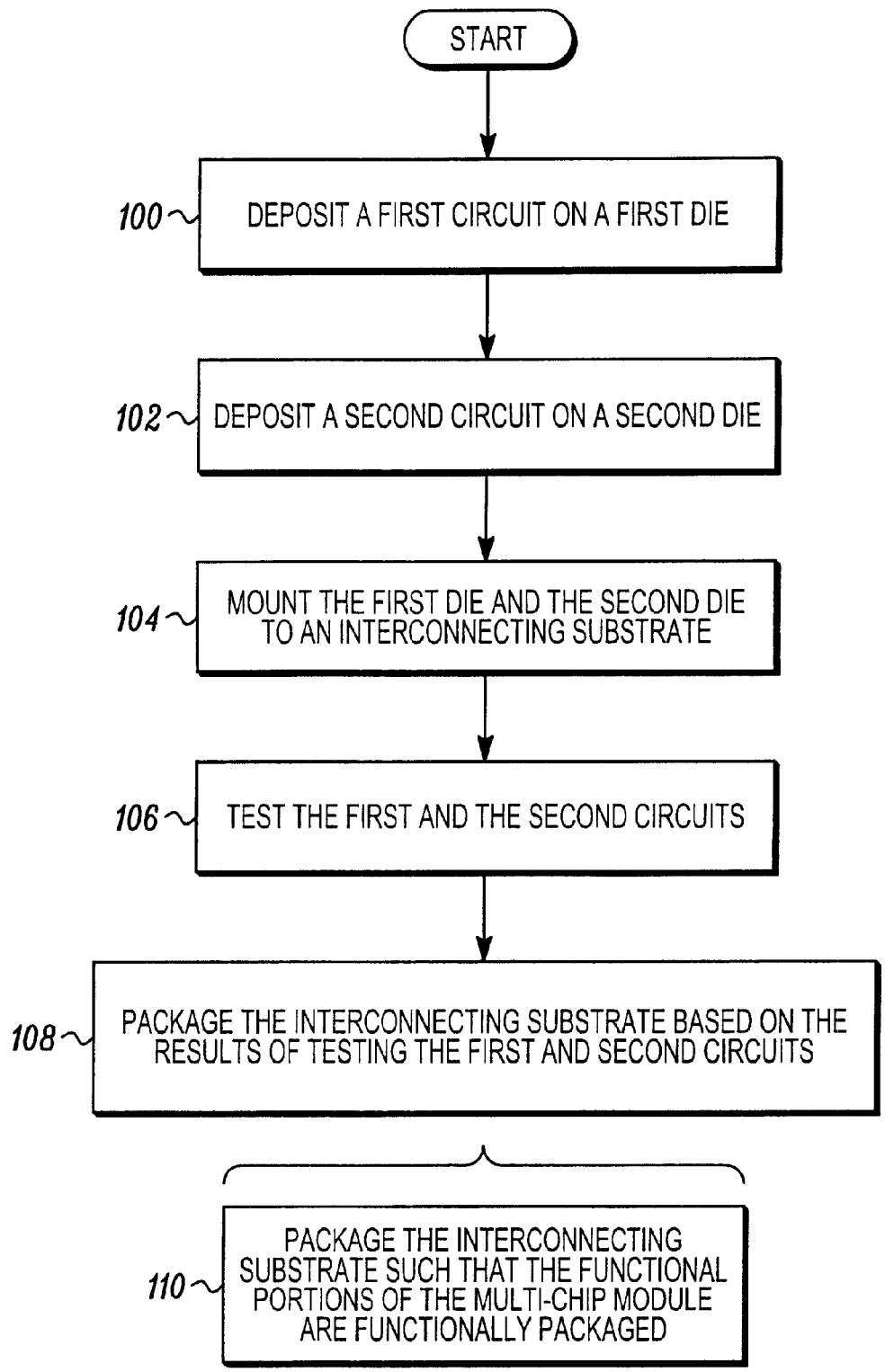
FIG. 2 illustrates a flow chart of a method for manufacturing a multi-chip module in accordance with the present invention.

FIG. 2 illustrates a flow chart of a method for manufacturing a multi-chip module. At step 100, a first circuit is deposited on a first die. The first circuit may be a video graphics circuit, another type of processing circuit, or any other circuit that can be deposited on an integrated circuit. The first die is preferably formed on a silicon substrate, but any other type of substrate upon which a circuit can be deposited may be used.

At step 102, a second circuit is deposited on a second die. As with the first circuit, the second circuit may be deposited on a silicon substrate, or any other type of substrate. Preferably the second circuit is a memory circuit, however, it may be one of many other types of circuits including processing circuits. At step 104, the first die and the second die are mounted to an interconnecting substrate, where the interconnecting substrate electrically couples the first die and the second die. Preferably, the interconnecting substrate is a multi-level substrate upon which multi-chip modules are generally deposited. More preferably, the interconnecting substrate is a four-layer substrate that allows for power, ground, and signal interconnections between the first circuit and the second circuit.

At step 106, the first circuit and the second circuit are tested in order to verify their functionality. The testing performed at step 106 may include disabling one of the first or second circuits in order to isolate the circuit under test. Testing each of the two circuits individually determines whether or not the circuits are both functioning or if one or both of the circuits is failing.

At step 108, the interconnecting substrate, which at this point includes the mounted first die and second die, is packaged based on the testing performed at step 106. At step 110, if the testing at step 106 determines that the first circuit and the second circuit are both functioning properly, the interconnecting substrate is packaged to reflect this. In other words, the interconnecting substrate will be coupled within the package so that both the first and second circuits can be utilized. If it is determined at step 106 that the first circuit is not functioning correctly, the interconnecting substrate will be packaged to reflect this in that only the second circuit will be coupled in a functional manner within the package. Similarly, if the second circuit is determined to be functioning incorrectly, the interconnecting substrate will be packaged such that the first circuit is the only circuit functionally packaged.

By testing each of the circuits within a multi-chip module and packaging the multi-chip module based on the testing, functional circuits within the multi-chip module can be utilized whether or not other portions of the multi-chip module are functional. In order to facilitate packaging the interconnecting substrate in a manner to allow only a portion of the multi-chip module to be utilized, configuration circuitry may be included on the multi-chip module. This may be included either within the interconnecting substrate, or within one of the integrated circuits mounted to the interconnecting substrate.

In another embodiment of the present invention, the testing of the circuits within the multi-chip module is not performed until after the multi-chip module has been packaged. In this case, if testing reveals that one or more of the circuits within the multi-chip module are not functioning correctly, configuration circuitry within the multi-chip module may be used to reconfigure the internal connections of the multi-chip module such that functional portions of the multi-chip module are allowed to function exclusive of the non-functioning portions. The configuration circuitry may reroute connections of the external connectors of the package such that the certain signals of the functioning portions of the multi-chip module are accessible rather than signals from the non-functioning blocks.

Figure 3:
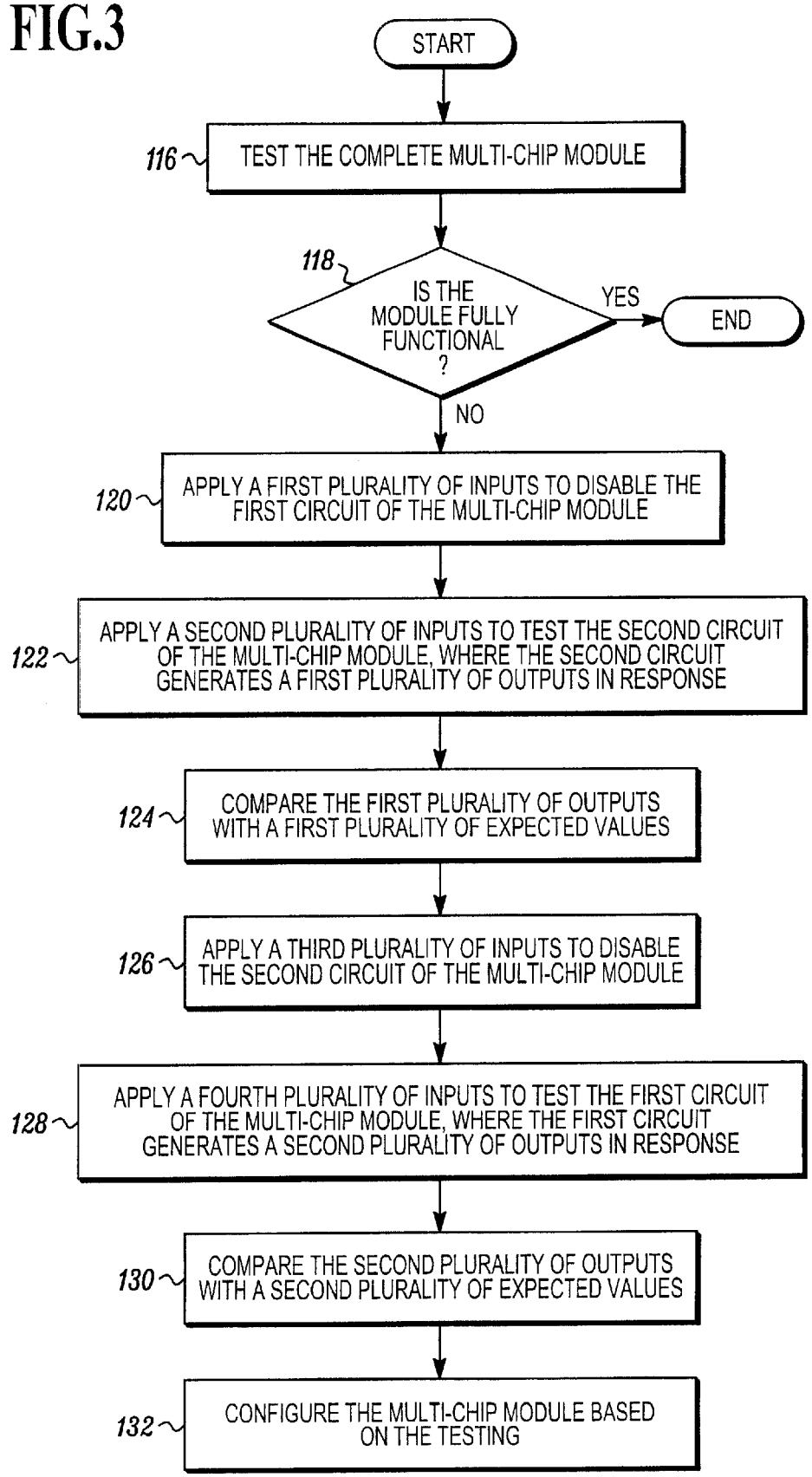
FIG. 3 illustrates a flow chart of a method for testing a multi-chip module in accordance with the present invention.

FIG. 3 illustrates a method for testing a multi-chip module that includes a first circuit, a second circuit, and an interconnecting substrate. Preferably, the first circuit of the multi-chip module is disposed on a first chip substrate, the second circuit is disposed on the second chip substrate, and the first and second chip substrates are mounted on the interconnecting substrate. The interconnecting substrate includes a first set of connectors that couple the first circuit to the second circuit. In an embodiment where the first circuit is a graphics processor, and the second circuit is a memory, the first set of connectors may include the address and data lines that couple these two devices.

The interconnecting substrate also includes a second set of connectors which couple control signals of the first circuit to a first portion of the externally accessible ports of the multi-chip module. If the first circuit is a graphics processor, the second set of connectors may couple control signals from the graphics processor to external ports of the multi-chip module for testing.

The interconnecting substrate further includes a third set of connectors which couple control signals of the second circuit to a second portion of the externally accessible ports of the multi-chip module. In an embodiment where a second circuit is a memory circuit, the control signals coupling to the second circuit may include control signals that control the memory. These signals may include a clock input, a chip select input, and a clock enable input.

At step 116, the multi-chip module is tested. The test performed at step 116 is preferably a test that exercises all of the functional circuit components of the multi-chip module. At step 118, if it is determined that the multi-chip module has passed this overall test, the module is determined to be fully functional and the testing process ends. If it is determined that there is a portion of the multi-chip module that is not functioning properly, the individual portions of the module need to be isolated to determine the location of the defective circuitry.

At step 120, a first plurality of inputs is applied to the externally accessible ports of the multi-chip module. The first plurality of inputs disables outputs of the first circuit within the multi-chip module. By disabling the outputs of one of the circuits within the multi-chip module, the other circuit within the multi-chip module may be tested without interference from the circuit that has been disabled.

At step 122, a second plurality of inputs is applied to the externally accessible ports of the multi-chip module. The application of the first plurality of inputs and the second plurality of inputs may be performed by a tester external to the multi-chip module. The second plurality of inputs test the second circuit within the multi-chip module. In response to the second plurality of inputs, the second circuit produces a first plurality of outputs. At step 124, the first plurality of outputs is compared to a group of expected values to determine if the second circuit is functioning correctly. The method can then continue in such a way as to test other circuits within the multi-chip module.

At step 126, a third plurality of inputs is applied to the externally accessible ports of the multi-chip module. The third plurality of inputs effectively disables the outputs of the second circuit of the multi-chip module. Once again by disabling one of the circuits within the multi-chip module other circuits are isolated for testing without interference. The inputs that disable the second circuit may further include inputs that disable other circuits that may be present within the multi-chip module. Disabling additional circuits within the multi-chip module further refines the isolation of the circuit that is to be tested.

At step 126 a fourth plurality of inputs is applied to the externally accessible ports of the multi-chip module. The fourth plurality of inputs is used to test the first circuit of the multi-chip module. In response to the fourth plurality of inputs, the first circuit of the multi-chip module produces a plurality of outputs that can be used to verify functionality of the first circuit. At step 130 this plurality of outputs is compared to a set of expected values to determine whether or not the first circuit is functioning correctly.

At step 132, the multi-chip module may be configured to reflect the fact that some of the circuits within the multi-chip module are or are not functioning properly. This configuration may include disabling circuits within the multi-chip module that are not functioning and rerouting internal and external connections to provide needed accessibility to certain portions or signals within the multi-chip module.

In an example case, assume that the multi-chip module for which the testing method is being utilized is a video graphics multi-chip module that includes a video graphic circuit, a first memory circuit, and a second memory circuit. In order to test the video graphics circuit, assume that both of the memory circuits need to be disabled. In order to accomplish this, a first a plurality of inputs is applied to the multi-chip module, which cause the first and second memory circuits to become disabled. Disabling these circuits may include tri-stating the outputs of these circuits.

Once the memories have been disabled, test vectors are applied to the video graphics circuit to determine whether or not that circuit is functioning properly. Once functionality of video graphics circuit is determined, the process can be repeated for each of the memory circuits. In other words, to test the first memory, the second memory and the video graphics circuit are disabled. Similarly, to test the second memory, the first memory and the video graphics circuit are disabled.

Once functionality of each of the three circuits is determined, configuration of the multi-chip module to reflect the functionality occurs. If all of the circuits within the multi-chip module are functioning correctly, configuration of the multi-chip module ensures that all of the circuits are interconnected and are coupled to external ports of the multi-chip module to allow for utilization of all of the circuits. If one or more of the circuits is found to be non-functional, these circuits may be disabled and then the multi-chip module packaged or configured within the package to allow for utilization of the remaining circuits that are functional. For example, if the first and second memories within the multi-chip module are found to be defective, the multi-chip module may be packaged or, if already packaged, configured within the package to allow the video graphics circuit within the multi-chip module to be utilized alone.

Figure 4:
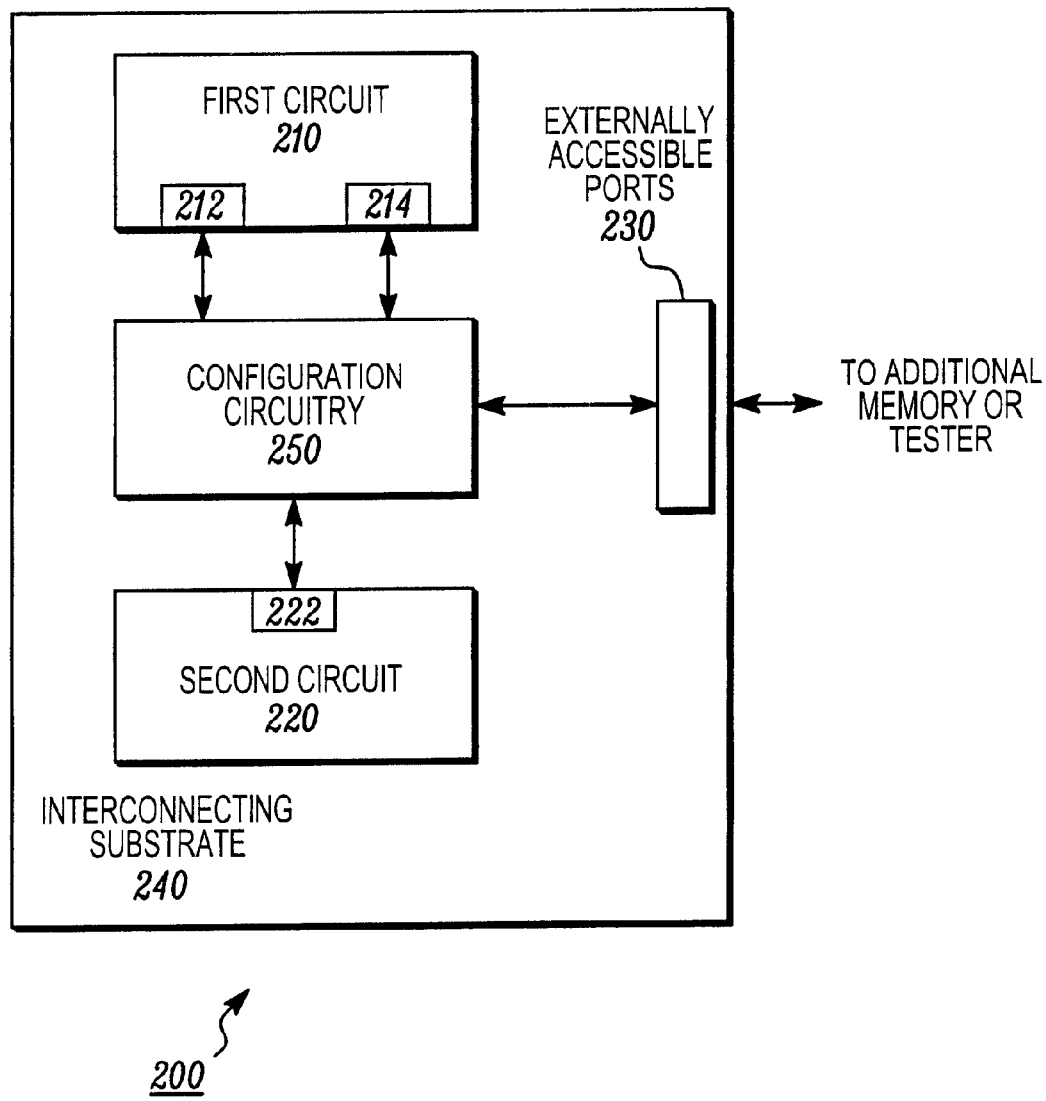
FIG. 4 illustrates a block diagram of a multi-chip module in accordance with the present invention.

FIG. 4 illustrates a multi-chip module 200 which includes an interconnecting substrate 240, a first circuit 210, a second circuit 220, and configuration circuitry 250. The interconnecting substrate 240 includes externally accessible ports 230. These externally accessible ports 230 may be pads located on a multi-chip module that allow the multi-chip module to be mounted inside of a package. Alternately, the externally accessible ports 230 are pins, pads, or bumps on a packaged multi-chip module. The interconnecting substrate 240 serves as a platform for mounting the first circuit 210 and the second circuit 220 The first circuit 210 is disposed on a first die, and the second circuit 220 is disposed on a second die. Both the first and second dice are mounted on the interconnecting substrate 240.

The configuration circuitry 250 is operably coupled to the interconnecting substrate 240, the first circuit 210, and the second circuit 220. In an operational mode, the configuration circuitry 250 operably couples a first set of signals 212 of the first circuit 210 to a first set of signals 222 of the second circuit 220, and it also couples a set of externally accessible ports 230 to a second set of signals 214 of the first circuit 210. Preferably the first circuit 210 is a graphics processing circuit, and the second circuit 220 is a memory circuit. In such a case, the first set of signals 212 of the first circuit 210 may be the first half of a large data bus that accesses the memory. The first set of signals 222 of the second circuit 220 is the corresponding portion of the memory circuit to which the bus is attached. The signal lines that are included in such a coupling would include control, address, and data signals.

The second set of signals 214 of the first circuit 210 is another portion of the bus that couples to memory circuits. This second portion of the bus is coupled to the externally accessible ports 230 to allow the graphics processing circuit to couple to external memory. Thus, in an operational mode, the first circuit 210 has a first set of signals 212 coupled to the second circuit 220 that may be a memory circuit. In addition, the first circuit 210 has a second set of signals 214 that are coupled to the externally accessible ports 230 such that additional external memory can be coupled in the system.

In a testing mode, the configuration circuitry 250 switches the connectivity of the externally accessible ports 230 based on control signals. Configuration circuitry 250 receives controls signals that may originate from within the first circuit 210 or may come from outside of the multi-chip module 200. These control signals cause the configuration circuitry to reroute the coupling of the externally accessible ports 230. For example, if the first circuit 210 is to be tested, the only portion of the memory bus that is accessible in operational mode is the second set of connectors 214. The first set of signals 212 is normally routed directly to the first set of signals 222 of the second circuit 220. Because this routing is performed within the multi-chip module 200, these signals are not readily available external to the multi-chip module 200. Thus, in order to access these signals, the externally accessible ports 230 are switched to couple to either the first set of signals 212 of the first circuit 210 or the first set of signals 222 of the second circuit 220.

If the configuration circuitry 250 receives control signals indicating that the first circuit 210 is to be tested, the configuration circuitry 250 may route the connections of the externally accessible ports 230 to the first set of signals 212 of the first circuit 210 for a portion of the testing. Another portion of the testing of the first circuit 210 may involve the multi-chip module 200 in the mode which couples the second set of signals 214 to the externally accessible ports 230, as these signals should also be tested. Similarly, if the configuration circuitry 250 receives control signals indicating that the second circuit 220 is to be tested, it will route the connections of the externally accessible ports 230 to the first set of connectors 222 of the second circuit 220.

When the configuration circuitry 250 is instructed to couple the external accessible ports 230 in such a manner as to allow the first circuit 210 or the second circuit 220 to be tested, the configuration circuitry 250 may also disable the circuit which is not being tested. For example, if the first circuit 210 is being tested, the configuration circuitry 250 may disable the second circuit 220.

Preferably, the first circuit 210 is a graphics processor, the second circuit 220 is a memory, and the externally accessible ports 230 are adapted to couple the multi-chip module 200 to additional memory. The memory 220 may include a number of smaller memory blocks, each of which provides a portion of the memory required by the graphics processor 210. In order to test the second set of connectors 214 of the graphics processor 210, and possibly any accompanying circuitry associated with those connectors, an external tester may access those connectors and that circuitry through the externally accessible ports 230 in the operational configuration.

When the tester wishes to access the first set of connectors 212 of the graphics processor 210, it will provide control signals to the configuration circuitry 250 such that externally accessible ports 230 are coupled to the first set of connectors 212. Additionally, the configuration circuitry 250 may disable the memory 220. Once tests on this portion of the multi-chip module 200 have been completed, the tester may send additional control signals to the configuration circuitry 250 such that the externally accessible ports 230 are coupled to the first set of connectors 222 of the memory 220. Once again, the configuration circuitry 250 may also disable the graphics processor 210 in order to allow the memory 220 to be fully tested without interference.

Thus, through the use of the set of externally accessible ports 230 which are normally used to couple additional memory to a multi-chip module 200, the configuration circuitry 250 can allow internal portions of the multi-chip module 200 which are normally not accessible to be tested.

Figure 5:
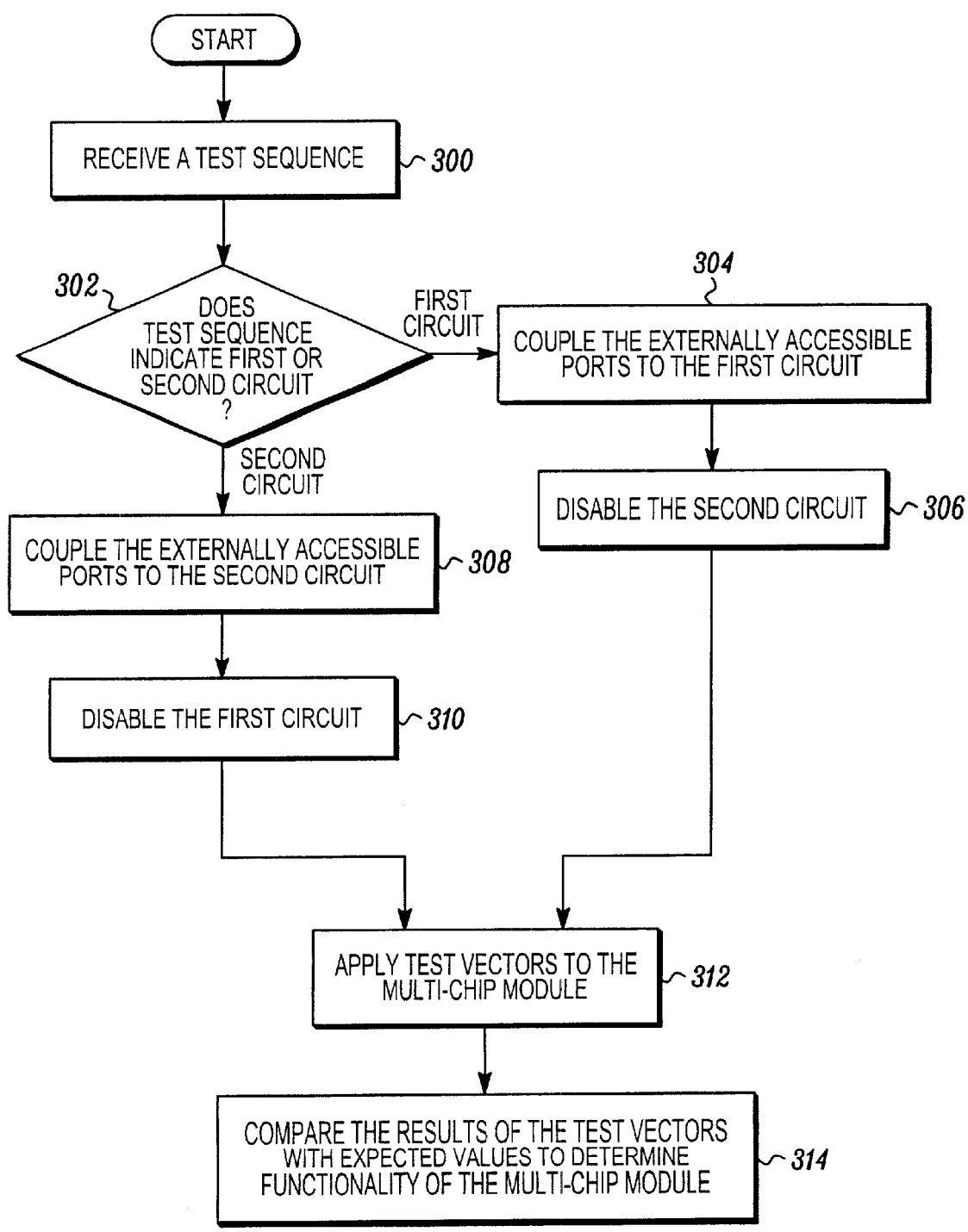
FIG. 5 illustrates a flow chart of a method for testing a multi-chip module in accordance with the present invention.

FIG. 5 illustrates a method for testing a multi-chip module where the multi-chip module includes a first circuit, a second circuit, and a set of externally accessible ports. As described with respect to FIG. 4, when the multi-chip module is in an operational mode a first set of signals of the first circuit is coupled to a first set of signals of the second circuit and a set of externally accessible ports is coupled to a second set of signals of the first circuit. At step 300, a test sequence is received, and coupling within the multi-chip module is altered based on the test sequence. At step 302 it is determined whether the test sequence indicates that the first or the second circuit is to be tested. When the first circuit is to be tested, the method proceeds to step 304 where the set of externally accessible ports is coupled to the first set of signals of the first circuit. At step 306, the second circuit may be disabled in order to allow the first circuit to be tested in isolation.

If at step 302 it is determined that the second circuit is to be tested, the method proceeds to step 308 in which the set of externally accessible ports is coupled to the first set of signals of the second circuit. At step 310, the first circuit may be disabled in order to allow the second circuit to be tested in isolation.

At step 312 test vectors are applied to the multi-chip module. At step 314, the results of the test vectors are compared with expected values to determine functionality of at least a portion of the multi-chip module. Thus, if the first circuit has been tested, the functionality of the first circuit will be known at step 314. Similarly, if the functionality of the second circuit has been tested via steps 308 and 310, the functionality of the second circuit will be known. The method can be repeated such that both the first and the second circuits are tested.

The testing methods described herein may be implemented either completely in software or through a combination of software and hardware within a processing system. The tests performed on the circuits within the multi-chip modules may originate from an external tester or they may be a result of a built-in self test (BIST) program. Similarly, when circuits within the multi-chip module are disabled, it may be the result of external signals being applied to the circuits or it may be the result of signals being applied to the circuits from within the multi-chip module.

By allowing individual portions of a multi-chip module to be tested separately and thoroughly, the functionality of each of the individual portions of the multi-chip module can be determined. By then allowing non-functioning portions of the multi-chip module to be effectively gated off from the other portions of the multi-chip module, functionality of the remaining portions of the multi-chip module can be preserved. The ability to recover a portion of the multi-chip module in the event of a partial failure effectively reduces the costs of manufacturing multi-chip modules. Because more and more complex circuits are being implemented in multi-chip modules, the invention described herein can be a great benefit to manufacturers attempting to build multi-chip modules with a large amount of complexity.

It should be understood that the implementation of other variations and modifications of the invention and its various aspects will be apparent to those of ordinary skill in the art, and that the invention is not limited to the specific embodiments described For example, the configuration circuitry that reroutes connections within the multi-chip module may actually be implemented external to the multi-chip module itself. The configuration circuitry could then interact between the multi-chip module through a limited amount of control signals that allow couplings within the interconnecting substrate to be rerouted based on testing and/or final functionality of the multi-chip module. It is therefore contemplated to cover by the present invention, any and all modifications, variations, or equivalents that fall within the spirit and scope of the basic underlying principles disclosed and claimed herein.

What is claimed is:

1. A video graphics multi-chip module comprising:

a video graphics circuit disposed on a first chip substrate;

a memory circuit disposed on a second chip substrate; and an interconnecting substrate operably coupled to the first chip substrate and the second chip substrate, wherein the interconnecting substrate electrically couples the video graphics circuit to the memory circuit, and wherein the interconnecting substrate includes external connectors for accessing signals within the video graphics multi-chip module.

2. The video graphics multi-chip module of claim 1,
wherein the video graphics circuit further comprises a first control signal output for controlling the memory circuit, wherein the first control signal output is coupled to a first external connector of the interconnecting substrate;

wherein the memory circuit further comprises a first control signal input for controlling the memory circuit, wherein the first control signal input is coupled to a second external connector of the interconnecting substrate;

wherein when the video graphics multi-chip module is in a testing mode, input to the first control signal input is provided via the second external connector and output from the first output control signal is received via the first external connector; and wherein when the video graphics multi-chip module is in an operational mode, the first external connector is coupled to the second external connector such that the first control signal output of the video graphics circuit drives the first control signal input of the memory.

3. The video graphics circuit of claim 2 further comprises a signal conditioning block operably coupled to the first external connector and second external connectors of the interconnecting substrate, wherein when the video graphics multi-chip module is in the operational mode, the signal conditioning block ensures signal integrity of the first control signal input.

4. The video graphics multi-chip module of claim 1,
wherein the video graphics circuit further comprises a plurality of control signal outputs for controlling the memory circuit, wherein each of the plurality of control signal outputs is coupled to a corresponding one of a first set of external connectors of the interconnecting substrate;

wherein the memory circuit further comprises a plurality of control signal inputs for controlling the memory circuit, wherein each of the plurality of control signal inputs is coupled to a corresponding one of a second set of external connectors of the interconnecting substrate;

wherein when the video graphics multi-chip module is in a testing mode, input to the plurality of control signal inputs is provided via the second set of external connectors and output from the plurality of control signal outputs is received via the first set of external connectors; and wherein when the video graphics multi-chip module is in an operational mode, each one of the first set of external connectors is coupled to a corresponding one of the second set of external connectors such that each of the plurality of control signal outputs drives a corresponding one of the plurality of control signal inputs.

5. The video graphics multi-chip module of claim 4 wherein the plurality of control signal outputs includes a clock output, a chip select output, and a clock enable output, and wherein the plurality of control signal inputs include a clock input, a chip select input, and a clock enable input.

6. The video graphics circuit of claim 5 further comprises a signal conditioning block operably coupled to at least one of the first set of external connectors and at least one of the second set of external connectors of the interconnecting substrate, wherein when the video graphics multi-chip module is in the operational mode, the signal conditioning block ensures signal integrity of at least one of the plurality of control signal inputs.

7. The video graphics circuit of claim 6, wherein the signal conditioning block ensures signal integrity of at least the clock input.

8. The video graphics multi-chip module of claim 5, wherein when a first set of signals is applied to the plurality of control signal inputs, the memory circuit is disabled such that the video graphics circuit can be tested without interference from the memory circuit.

9. The video graphics multi-chip module of the claim 8, wherein when the first set of signals is applied to the plurality of control signal inputs, the outputs of the memory circuit are tri-stated.

10. The video graphics multi-chip module of claim 9, wherein the first set of signals is generated by a tester external to the video graphics multi-chip module.

11. The video graphics multi-chip module of claim 1, wherein the video graphics circuit includes a video graphics circuit control input, wherein the video graphics circuit control input is coupled to an external connector of the interconnecting substrate, wherein when the video graphics circuit control input is asserted, the video graphics circuit is disabled.

12. The video graphics multi-chip module of claim 1, wherein the interconnecting substrate is a four-layer substrate, wherein each layer of the substrate is composed of conducting material for use in coupling the video graphics circuit to the memory circuit.

13. The video graphics multi-hip module of claim 1, wherein the external connectors of the interconnecting substrate are bump connectors of a bump grid array.

14. The video graphics multi-chip module of claim 1 further comprises configuration circuitry operably coupled to the video graphics circuit and the memory circuit, and wherein the configuration circuitry configures the video graphics multi-chip module based on the functional status of the video graphics circuit and the memory circuit.

15. The video graphics multi-chip module of claim 14, wherein the configuration circuitry configures the video graphics multi-chip module to use only the video graphics circuit when the memory circuit failed the testing.

16. The video graphics multi-chip module of claim 14, wherein the configuration circuitry configures the video graphics multi-chip module to use only the memory circuit when the video graphics circuit failed the testing.

17. The video graphics multi-chip module of claim 1 further comprises a second memory circuit disposed on a third chip substrate, wherein the interconnecting substrate operably couples the second memory circuit to the video graphics circuit.

18. A method for manufacturing a multi-chip module, the method comprising:
depositing a first circuit on a first die;
depositing a second circuit on a second die;
mounting the first die and the second die to an interconnecting substrate, wherein the interconnecting substrate electrically couples the first die and the second die;
testing the first circuit and the second circuit;
packaging the interconnecting substrate including the first die and the second die, wherein the packaging is based on the testing.

19. The method of claim 18, wherein the first circuit includes a video graphics circuit and the second circuit includes a memory.

20. The method of claim 18, wherein packaging further comprises packaging the interconnecting substrate such that only portions of the multi-chip module which pass testing are functionally packaged.

21. A method for testing a multi-chip module comprising:
applying a first plurality of inputs to externally accessible ports of the multi-chip module, wherein the first plurality of inputs disables outputs of a first circuit of the multi-chip module, wherein the multi-chip module includes:
the first circuit disposed on a first chip substrate
a second circuit disposed on a second chip substrate;
an interconnecting substrate, wherein the interconnecting substrate includes:
a first set of connectors coupling the first circuit to the second circuit;
a second set of connectors coupling control signals of the first circuit to a first portion of the externally accessible ports of the multi-chip module; and
a third set of connectors coupling control signals of the second circuit to a second portion of the externally accessible ports of the multi-chip module;
applying a second plurality of inputs to the externally accessible ports of the multi-chip module, wherein the second circuit of the multi-chip module produces a first plurality of outputs in response to the second plurality of inputs; and
comparing the first plurality of outputs to a first plurality of expected values to determine if the second circuit is functioning correctly.

22. The method of claim 21 further comprises:
applying a third plurality of inputs to the externally accessible ports of the multi-chip module, wherein the third plurality of inputs disables outputs of the second circuit of the multi-chip module;
applying a fourth plurality of inputs to the externally accessible ports of the multi-chip module, wherein the first circuit of the multi-chip module produces a second plurality of outputs in response to the fourth plurality of inputs; and
comparing the second plurality of outputs to a second plurality of expected values to determine if the first circuit is functioning correctly.

23. The method of claim 22 further comprises configuring the multi-chip module such that circuits of the multi-chip module that are not functioning correctly are disabled.

24. The method of claim 21, wherein the first circuit includes a memory circuit and the second circuit includes a video graphics circuit.

25. A multi-chip module comprising:
an interconnecting substrate, wherein the interconnecting substrate includes a set of externally accessible ports;
a first circuit disposed on a first die, wherein the first die is mounted to the interconnecting substrate;
a second circuit disposed on a second die, wherein the second die is mounted to the interconnecting substrate; and
configuration circuitry operably coupled to the interconnecting substrate, the first circuit, and the second circuit, wherein in an operational mode:
the configuration circuitry operably couples a first set of signals of the first circuit to a first set of signals of the second circuit, and the configuration circuitry operably couples the set of externally accessible ports to a second set of signals of the first circuit; and
wherein in a testing mode the configuration circuitry switches the connectivity of the externally accessible ports based on control signals.

26. The multi-chip module of claim 25, wherein when the configuration circuitry receives control signals including a first circuit test configuration sequence, the configuration circuitry couples the externally accessible ports to the first set of signals of the first circuit.

27. The multi-chip module of claim 26, wherein when the configuration circuitry receives control signals including a first circuit test configuration sequence, the configuration circuitry disables the second circuit.

28. The multi-chip module of claim 25, wherein when the configuration circuitry receives control signals including a second circuit test configuration sequence, the configuration circuitry couples the externally accessible ports to the first set of signals of the second circuit.

29. The multi-chip module of claim 28, wherein when the configuration circuitry receives control signals including a second circuit test configuration sequence, the configuration circuitry disables the first circuit.

30. The multi-chip module of claim 25, wherein the first circuit includes a graphics processor, the second circuit includes a first memory, and wherein the set of externally accessible ports are adapted to couple to a second memory.

31. A method for testing a multi-chip module, wherein the multi-chip module includes a first circuit, a second circuit, and a set of externally accessible ports, wherein in an operational mode, a first set of signals of the first circuit is coupled to a first set of signals of the second circuit, and the set of externally accessible ports is operably coupled to a second set of signals of the first circuit, the method comprising:
receiving a test sequence, wherein coupling within the multi-chip module is altered based on the test sequence, wherein when the test sequence indicates a first circuit test, the set of externally accessible ports is coupled to the first set of signals of the first circuit,
wherein when the test sequence indicates a second circuit test, the set of externally accessible ports is coupled to the first set of signals of the second circuit;
applying test vectors to the multi-chip module; and
comparing results of the test vectors with expected values to determine functionality of at least a portion of the multi-chip module.

32. The method of claim 31, wherein receiving further comprises:
when the test sequence indicates a first circuit test, disabling the second circuit, and
when the test sequence indicates a second circuit test, disabling the first circuit.

* * * * *